United States Patent [19]

Cusano et al.

[11] 3,994,430
[45] Nov. 30, 1976

[54] DIRECT BONDING OF METALS TO CERAMICS AND METALS

[75] Inventors: Dominic A. Cusano, Schenectady; James A. Loughran, Scotia; Yen Sheng Edmund Sun, Auburn, all of N.Y.

[73] Assignee: General Electric Company, Syracuse, N.Y.

[22] Filed: July 30, 1975

[21] Appl. No.: 600,300

[52] U.S. Cl. .................................. 228/122; 228/903
[51] Int. Cl.² ........................................ B23K 31/02
[58] Field of Search.... 228/122, 123, 124, 193–198, 228/208, 209, 238, 903

[56] References Cited
UNITED STATES PATENTS
3,911,553  10/1975  Burgess et al. .................. 228/195 X Primary Examiner—Al Lawrence Smith
Assistant Examiner—Margaret Joyce
Attorney, Agent, or Firm—R. J. Mooney; D. E. Stoner

[57] ABSTRACT

Disclosed is a method of bonding metals to substrates such as ceramics or metals. A bonding agent forms a eutectic alloy with the metal to provide bonding. Several methods of supplying the bonding agent to the system are disclosed. However, regardless of which method of introducing the bonding agent into the system is employed, the quantity of the bonding agent is carefully controlled so that the compound in the region of the bond is hypoeutectic. To form the bond, the metal and the substrate are placed adjacent each other and the bonding agent is introduced into the system. The system is then heated to a temperature between the eutectic temperature and the melting point of the metal for a preselected time. The system is then cooled to form a bond. The heating is carried out in an inert atmosphere or a vacuum.

44 Claims, 18 Drawing Figures

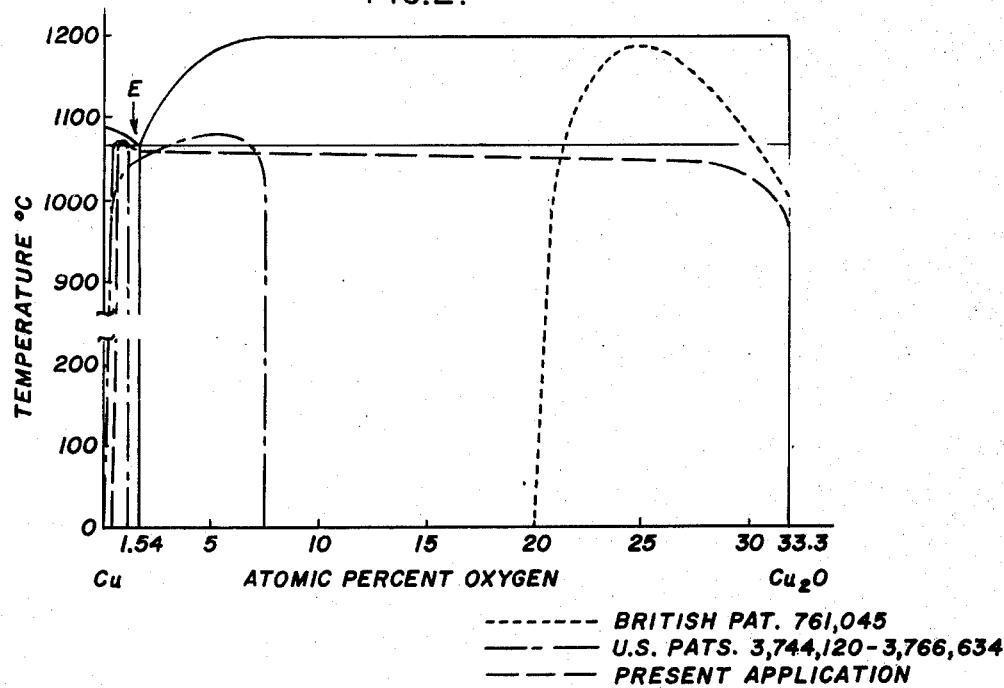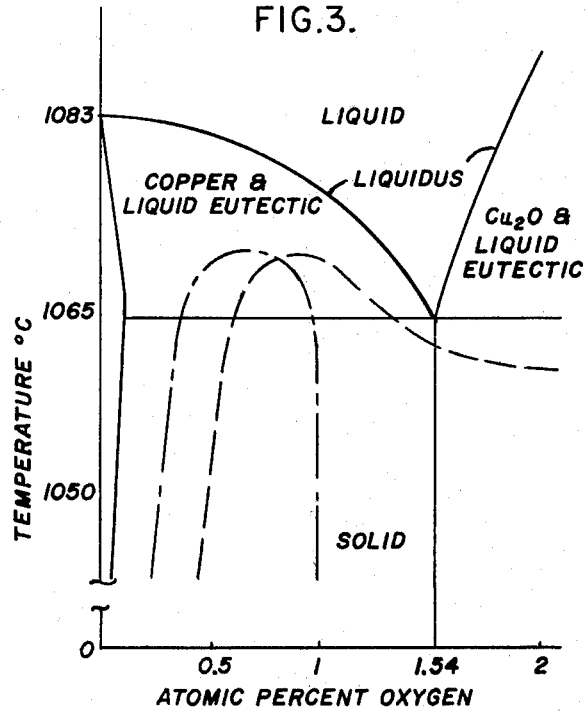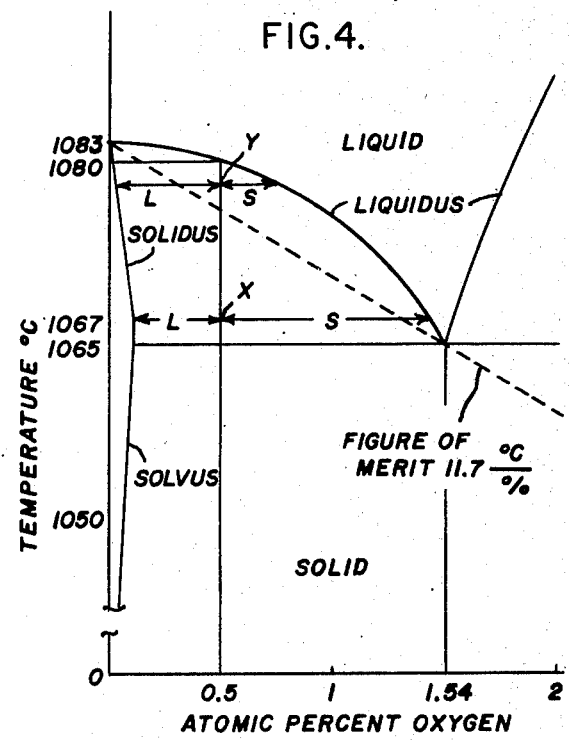

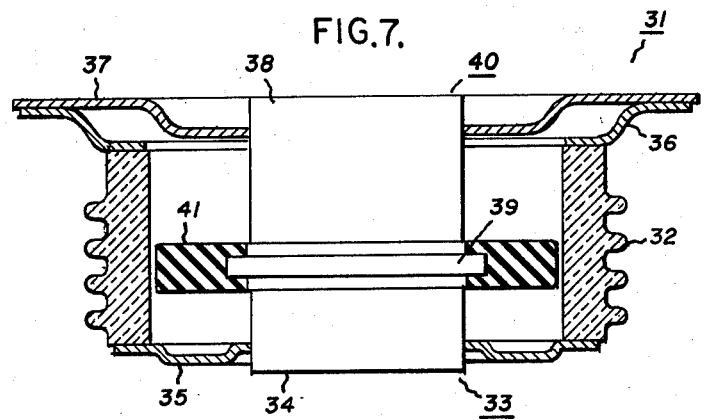
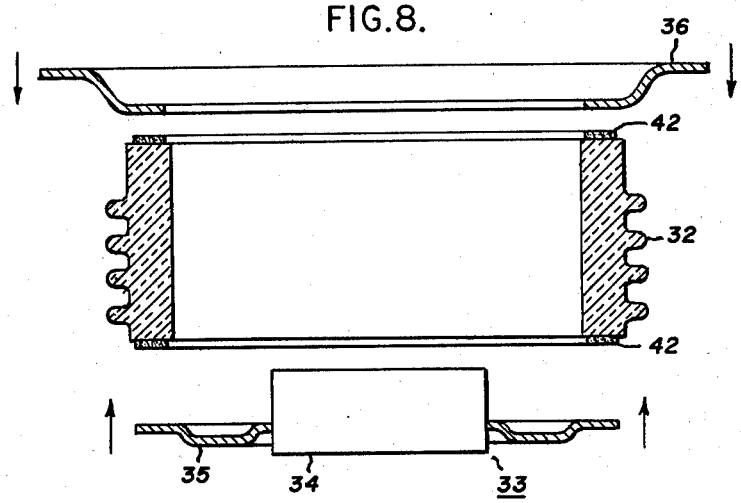
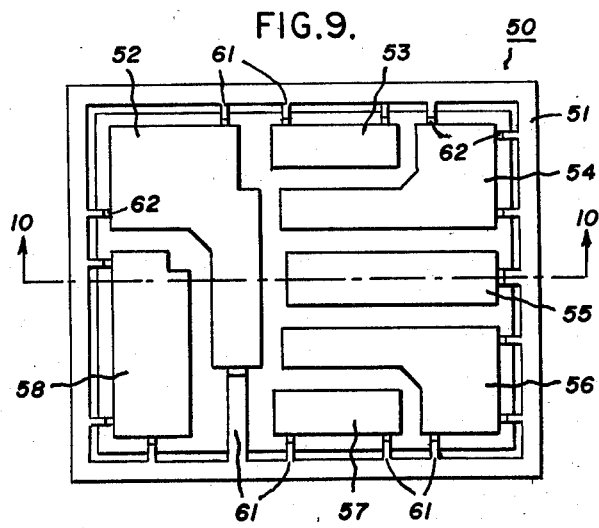

3,994,430

DIRECT BONDING OF METALS TO CERAMICS AND METALS

BACKGROUND OF THE INVENTION

This invention relates to a method of directly bonding metals to substrates such as a ceramic or a metal and, more particularly, to a method of performing the bonding operation in an inert atmosphere.

The general subject of bonding metals to ceramics or to other metals is not new. Such processes have been of interest to many industries for some time. For example, spark plug manufacturers have long faced the problem of bonding ceramic insulators to metallic spark plug bases.

Various methods of bonding nonmetallic members to metallic members have been employed in the past. One exemplary method includes the application of a mixture of titanium hydride and a solder metal, such as copper, silver, or gold, to the member to be metallized or bonded. Next, the hydride is disassociated by the application of heat in the presence of the solder metal. In this process, the heating is preferably done in a nonoxidizing atmosphere, such as pure dry hydrogen. The description found in U.S. Pat. No. 2,570,248 is typical of such a process.

Another method of bonding metals to ceramics is described by J. T. Klomp of Philips Research Laboratories. This method is described as employing low-oxygen affinity metals applied to a ceramic under high pressures, e.g., 1 Kg/cm². Where oxygen-affinity metals are employed, sufficiently high pressures are required "to destroy the oxide film so that metal-ceramic contact can be made." Hence, this method employs extremely high pressures to effect bonding. While these methods may produce desirable bonds for many applications, obviously the most desirable bonding system would be a direct bond between the copper and the ceramic substrate which did not require high pressures to form.

Another process for forming metallic bonds is described in U.S. Pat. No. 2,857,663 by James E. Beggs. Basically, this method employs an alloying metal, such as metal from the titanium group, IVb of the Periodic Table, and an alloying metal, such as copper, nickel, molybdenum, platinum, cobalt, chromium or iron. When the alloying metal and a member of the titanium group are placed between non-metallic refractory materials or a non-refractory metallic material and a metallic material and are heated to a temperature at which a eutectic liquidus is formed, a strong bond forms between the adjacent members. While this process has been satisfactory for many applications, the desire to improve the integrity of the bond, increase the thermal conductivity between a metal member and a non-metallic refractory member as well as provide a high current carrying conductor on the non-metallic refractory member has prompted researchers to seek still other methods of bonding metals to nonmetals.

The formation of bonds between two metallic members has been achieved in various ways. For example, certain metals can be bonded together with the use of solders. Other metals are bonded together by welds, such as arc welds or spot welds. Where certain metals can not be directly bonded to each other, generally intermediate metallic members are used to form the bond. The foregoing methods are frequently not compatible with demanding applications, such as integrated circuit fabrication, or, if compatible, are frequently economically unacceptable.

More recently, methods of bonding metals to metals and metals to ceramics have been developed utilizing only a eutectic of the metal and a gas as a bonding medium. Descriptions of these methods will be found in U.S. Pat. Nos. 3,744,120 (Burgess, et al) and 3,766,634 (Babcock, et al), both assigned to the assignee of the present invention. The metal-gas eutectic process, as taught in the referenced patents, involves placing the metal to be bonded on the ceramic or metal substrate. The combination is then heated in the presence of a reactive gas to a temperature below the melting point of the metal but sufficiently high that the eutectic is formed between the metal and the gas. While this method has proven successful for certain applications, further improvement was desired. One reason improvement was desired is that there is a reaction between the gas and the metal. For particularly demanding applications, this may cause a problem. For example, when bonding copper to ceramics for use in hybrid electronics circuits, the use of the reactive atmosphere causes a coating of copper oxide to be formed on the copper, thus sometimes necessitating an oxide removal step.

It is, therefore, an object of this invention to provide a method for directly bonding metals to substrates of ceramic or metal which overcomes the aforementioned disadvantages of the prior art.

SUMMARY OF THE INVENTION

This invention is characterized by a method of bonding metals to substrates of ceramic or metal. The bond formed is considered a direct bond inasmuch as there is no intermediate layer of solder metal or the like. There is a bonding agent employed but the quantity of bonding agent is very small as will become apparent below. The bonding agent is selected to be one which forms a eutectic alloy with the metal which consists predominately of the metal. The eutectic temperature must be below, but is preferably relatively close to, the melting point of the metal.

To bond a selected metal workpiece to a selected substrate, which can be either a ceramic or a metal, a controlled small amount of the bonding agent is introduced to the system and the workpiece is positioned on the substrate where it is to be bonded. Next, the metal and substrate are heated in an inert atmosphere to a temperature between the eutectic temperature and the melting point of the metal for a time sufficient to form a eutectic melt between the metal and the substrate. Upon cooling and solidification of the melt, the bond is formed.

The amount of bonding agent present is carefully controlled so that the mixture of bonding agent and metal is at all places hypoeutectic, at least at the termination of the process. Inasmuch as the mixture is hypoeutectic, only two phases are present in the melt: the liquid eutectic alloy and the metal. There is a precipitated or free bonding agent present. Thus, the metal retains most of its natural properties such as normal and electrical resistance. An additional advantage resulting from operation in the hypoeutectic region is that the metal remains primarily in the solid state. Thus, its dimensional and structural integrity are maintained as well as good surface quality.

Several options are available for associating the metal with the bonding agent. From a processing standpoint, the easiest method is to select a metal having therein a sufficient amount of dissolved or precipitated bonding agent. For example, some electrolytic tough pitch copper contains a sufficient amount of oxygen to permit it to be bonded directly to ceramics such as alumina or beryllia without the addition of further oxygen.

Another option is to pre-react the metal with a controlled amount of the bonding agent to form a very thin layer of a compound of the two materials on the surface of the metal. Such a reaction can be carried out by any conventional method. It has been found that the thin layer of the compound can be on either side of the metal. If the compound is placed on only one side of the metal and that side is opposite the substrate during the bonding process, a sufficient amount of bonding agent will diffuse through the metal at the bonding temperature to form the bond if enough time is allowed.

Still another method of introducing the bonding agent is depositing the bonding agent or a compound of the bonding agent and the metal in a particulate form on either the substrate or the metal. Then, the substrate and the metal are juxtaposed as they are to be finally bonded and the process proceeds as previously described. When depositing the particulate matter, it has been found preferable to use a binder to make the material easier to handle. However, the binder is preferably selected to be one which vaporizes at or below the bonding temperature.

It is, of course, realized by those skilled in the art that not all metals will bond to all substrates. Furthermore, it is known that a bonding agent which will bond a given metal to a given substrate may not bond that metal to other substrates. For example, utilizing oxygen as the bonding agent to bond copper to a ceramic substrate works very well. However, oxygen will not function as a bonding agent to bond copper to stainless steel. Sulphur will effectively function as a bonding agent between copper and stainless steel, however, sulphur will not act as a bonding agent between copper and a ceramic substrate. The reasons for this behavior are not fully understood. However, it is known that the metal-bonding agent eutectic must wet the substrate. Furthermore, it is theorized that there must be a potentially stable compound of the substrate and eutectic and that if such a compound is not formed, there will be no tenacious bond. However this is only theory. Nevertheless, as stated above, it is well known to those skilled in the direct bonding art that not all possible combinations of metal, substrate and bonding agent will bond. Therefore, the claims appended to this specification must be read as encompassing only those combinations that will form a bond.

Assuming that the bonding agent selected is compatible with the metal and the substrate, that is, it will form a direct bond, it has been discovered that a figure of merit for measuring its compatibility with the subject process can easily be determined. The figure of merit is the absolute slope of a straight line connecting the melting point of the metal and the eutectic point on a phase diagram of the metal and the bonding agent. The figure of merit is preferably between one and one hundred degrees Celsius per atomic percent of bonding agent. Most preferably, the figure of merit is approximately ten degrees Celsius per atomic percent. For reasons which will be explained below, it is desirable that the eutectic temperature and the melting point of the metal be relatively close together and, as will be further explained below and as has been mentioned previously, it is desired that the eutectic be predominately composed of the metal. A large figure of merit indicates a relatively large span between the melting point and the eutectic temperature as compared to the percentage of bonding agent in the eutectic. A small figure of merit indicates a relatively large amount of bonding agent in the eutectic.

DESCRIPTION OF THE DRAWINGS

These and other features and objects of the present invention will become more apparent upon a perusal of the following description taken in conjunction with the accompanying drawings wherein:

FIG. 2 is a portion of the copper-oxygen phase diagram which is illustrative of some of the salient features of the present invention;

FIG. 3 is an enlarged portion of the phase diagram of FIG. 2 annotated to highlight some of the features of the present invention;

FIG. 4 is the enlarged portion of FIG. 3 with different annotations to further explain the process of the present invention;

FIG. 7 is a sectional elevation view of a pressure mounted semiconductor housing that can be advantageously made by the method of the present invention;

FIG. 8 illustrates the fabrication of the housing shown in FIG. 7;

FIG. 9 is a plan view of a metal lead frame that is utilized to form a conductive circuit in accordance with the teachings herein;

DESCRIPTION OF THE PREFERRED METHOD

Figure 1:
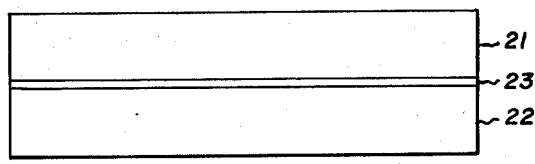
FIG. 1 is an elevation view of a metal and a substrate bonded in accordance with the subject invention.

Referring first to FIG. 1, there is shown a sectional elevation view of a metal 21 directly bonded to a substrate 22 with a eutectic interface layer 23 therebetween. The eutectic is a metal and bonding agent as will be discussed below. The eutectic layer is so named for convenience. It really consists of only a small amount of eutectic as will be evident from a study of FIGS. 2–4 below. The layer is actually primarily metal but includes enough eutectic to form a bond in a manner not fully understood. The substrate can be either a ceramic or a metal and, if it is a metal, it can be the same metal as the member 21 or a different metal. The term ceramic is to be construed broadly and includes, for example, glasses and monocyrstalline and polycrystalline solids.

The aforementioned patents of Burgess and Babcock (both assigned to the present assignee) describe methods for bonding metals to metals and ceramics by means of a eutectic in a reactive atmosphere. As will become apparent below, the method employed in the aforementioned patents is substantially different from the method contemplated herein. However, the structure resulting is similar and thus an understanding of the bond and its characteristics can be gleaned from the aforementioned patents.

According to one feature that is common to the methods of Burgess, Babcock, and the present invention, the bonding process is carried out at an elevated temperature. Specifically, the metal 21 and the substrate 22 are heated to a temperature below the melting point of the metal in the presence of a bonding agent. The bonding agent is one which forms a eutectic with the metal, and the heating is to a temperature in excess of the eutectic temperature. Thus, a melt is formed including eutectic liquid. The melt must wet the substrate and, upon cooling and resultant solidification, it will bond tenaciously thereto. Taking a bond between copper and alumina ulilizing a copper-copper oxide eutectic as an example, bond strengths in excess of 20,000 pounds per square inch and peel strengths in excess of 70 pounds per inch have been achieved.

It should be realized that simply bringing any metal 21 and any substrate 22 together and forming a eutectic melt therebetween is not sufficient to insure bonding on cooling. While the nature of the bond is not fully understood, it is believed that there must be some bonding, such as covalent bonding, or a potential compound, between the eutectic 23 and the substrate 22 in order to form a bond. Thus, while a copper oxide eutectic forms a good bond with a ceramic, a copper oxide eutectic will not bond to stainless steel. It is believed that rather than forming a bond with the copper oxide, the steel scavenges the oxygen from the eutectic because iron oxide is more stable than copper oxide at the elevated temperature involved. However, cooper sulfide bonds well to stainless steel but will not bond to copper. This problem has been known for some time and selection of a proper eutectic and substrate is within the ability of those skilled in the art. Such selection can be made on the basis of known working combinations such as disclosed by Burgess and Babcock, or new combinations can be ascertained by simple trial and error processes.

It can be said that the selection of a bonding system for bonding a given metal and a given substrate is a twostep process. First, a bonding agent must be selected that is compatible with the substrate. Secondly, it must be determined whether or not the bonding agent is one which works well with the metal. The present invention is not concerned with the problems of insuring that the eutectic selected will bond to the selected substrate. The invention does determine guidelines with respect to the interrelationship between metal and bonding agent that should be present to form a good eutectic. The invention further specifically sets forth the steps of an improved bonding process.

Referring now to FIG. 2, there is shown a phase diagram for copper and cuprous oxide. A study of this phase diagram will highlight what the applicants believe are the most pertinent prior art processes and also the distinctions between those processes and their process and furhermore will illustrate the advantages of their process as compared to the prior art. It should be emphasized that the following discussion of the copper and oxygen phase diagram is illustrative only. The present invention is not limited to copper or oxygen, nor were several of the referenced prior art inventions. Two significant points in the phase diagram are the eutectic point E occurring at 1065° Celsius and 1.54 atomic percent oxygen and the melting point of copper at 1083° C.

Consider first the processes disclosed in the aforementioned patents to Burgess and Babcock. The primary distinction between those patents is that the patent to Babcock deals with bonding metals to ceramics and the patent to Burgess deals with bonding metals to metals. However, for the following discussion of FIG. 2, that distinction is unimportant. The two methods are identical insofar as their treatment of the eutectic is concerned.

As mentioned previously, the bond is formed by a eutectic 23 which is present at least at the interface between the metal 21 and the substrate 22. It is the composition of that eutectic at its interface with the substrate 22 that is significant for the present discussion. The lines in FIG. 2 which are associated with particular processes indicate the composition (i.e., the location on the phase diagram) of the eutectic at the interface during the practice of the respective processes.

Burgess and Babcock carry out their processes by positioning copper on a substrate and heating the combination in a reactive atmosphere. As described by them, the reactive component in the atmosphere (in the example being explored, oxygen) is only a small portion thereof. For example, the reactive component is less than one percent of the total atmosphere. However, that small quantity of reactive component supplies the oxygen to form the eutectic and thus form the bond.

The path followed when practicing the methods of Burgess and of Babcock is as follows: initially, the interface between the copper 21 and the substrate 22 is free of oxygen. Thus, the line originates at zero percent oxygen. However, as time passes and the temperature increases, the region of the copper 21 around the interface becomes slightly oxidized (along with the entire copper surface) and thus the path deviates from the zero oxygen line. It will be appreciated from an observation of FIG. 2 and the enlarged FIG. 3 that the line deviates most rapidly at elevated temperatures. That is so because as the temperature of the system approaches the melting point of copper, a significant amount of gas diffuses into and reacts with the copper. Once the eutectic temperature 1065° Celsius is reached, a liquid eutectic is present and the deviation becomes more rapid because liquid diffusion is more rapid than solid diffusion.

For purposes of illustration, the path indicating the process of Burgess and of Babcock separates into two branches at about 1030° C. A first branch continues into the hypoeutectic region of the phase diagram above the eutectic temperature and to the left of the eutectic point as indicated most clearly in FIG. 3. As indicated in FIG. 3, the hypoeutectic region represents a two-phase composition consisting of metallic copper and liquid eutectic. It is the liquid eutectic that wets the substrate 22 and, upon cooling to a temperature below 1065° C, solidifies and forms the bond. As is indicated most clearly in FIG. 2, once the combination has been cooled to a temperature significantly below the eutectic temperature, there is little change in the oxygen content.

The second branch of the line depicting the process of Burgess and of Babcock indicates a cycle during which more oxygen is absorbed from the atmosphere. Oxygen content can be increased as shown by the second branch by increasing the time span of the cycle to cause the system to remain at a higher temperature for a longer period of time. If the process is slow enough, or the oxygen content of the atmosphere high enough, the zone 23 may contain more than the eutectic composition of oxygen by the time the eutectic temperature is reached. In the event, as indicated most clearly in FIG. 3, the region 23, when above 1065° C, will be hypereutectic and contain solid cuprous oxide and liquid eutectic. As explained with respect to the first exemplary cycle of this process, a bond will be formed by the eutectic upon cooling.

It should be emphasized that the first exemplary cycle of Burgess and Babcock is preferred inasmuch as the region 23, when solidified following the first process, consists of metallic copper and solid eutectic alloy. Thus, the region 23 is electrically and physically much like metallic copper and can be utilized as part of an electrical conductor or the like. Following the second exemplary cycle, the solidified region 23 consists of cuprous oxide and solidified eutectic alloy and thus deviates more in its properties from metallic copper.

The process outlined in British Patent 761,045 contemplates heavily pre-oxidizing copper and then positioning the copper on the substrate and heating the combination to a temperature in excess of the melting point of copper (1083° C) but below the melting point of cuprous oxide (about 1200° C). The atmosphere can be either reactive or nonreactive.

More specifically, the process begins by the formation of a layer of copper oxide on the copper. However, as is well known in the art and as pointed out in the British Specification, any cupric oxide substantially completely converts to cuprous oxide during the heating cycle. Thus, the line indicating the British process enters the phase diagram of FIG. 2 at an elevated temperature on the right hand side indicating the conversion of the surface layer of cupric oxide to cuprous oxide. Then, the process continues as the metal is heated to a temperature above the melting point of copper. It is emphasized in the British Specification that the copper melts but the oxide does not. It is therefore clear that the process defined is carried out to the right of the eutectic point, for if the combination were hypeutectic and above 1083° C, only liquid would remain. The interface 23, after solidification, as practiced according to the British Specification, therefore contains solid cuprous oxide and eutectic alloy.

The path indicating the process of the British Patent continues to the left after complete conversion to cuprous oxide because, at the elevated temperatures involved, the liquid copper combines slowly with the oxide to form a eutectic phase, thus increasing copper content in the oxide region.

The direct bonding method of the present invention, when practiced with copper and copper oxide, in its simplest form is initiated by oxidizing the surface of the copper with copper oxide. The oxide is thin and may be formed in any of several ways. For example, it may be thermally grown, formed by anodization, or chemically grown. Chemical growth is possible by utilizing an oxidizing compound sold by Enthone, Inc., of New Haven, Connecticut, under the name Ebonol C.

As was explained previously with respect to the British Patent, at elevated temperatures any cupric oxide converts to cuprous oxide. Thus, the line indicating the present process enters the phase diagram of FIG. 2 at an elevated temperature as pure cuprous oxide. With continued heating and the passage of time, the line indicating the present process moves to the left very rapidly. The motion indicated is more rapid than the motion indicated with respect to the process described in the British Patent because the oxide layer deposited during the practice of the present invention is far thinner than the oxide layer deposited in the method defined by the British Specification. This is clearly so because the practice as described in the British Specification utilizes the thick oxide layer to provide dimensional stability for the copper. However, the oxide in the present method is utilized only to provide oxygen for the bonding process and, inasmuch as the present method contemplates the region 23 becoming hypoeutectic, the oxygen supply must be small. Thus, the small amount of oxygen rapidly diffuses away from the copper surface, increasing the relative amount of copper at the surface.

By operating within the conditions set forth below, the composition of the region 23 can be made hypoeutectic prior to attaining the eutectic temperature of 1065° C. Thus, as indicated most clearly in FIG. 3, when the first liquid appears, the solution is hypoeutectic as preferred. Thus, upon solidification and bonding, the region 23 will consist of copper and eutectic alloy and be substantially free of copper oxide. It is significant that the Applicants' process is carried out in an inert atmosphere so that no additional oxygen can enter the system at the elevated temperatures used and thus cause the final melt to be hypereutectic.

It is evident from a study of FIGS. 2 and 3 that the methods described by Burgess and Babcock can also provide a hypoeutectic region 23 with the advantages enumerated above. However, for particularly demanding applications, the Applicants' technique, which is carried out in an inert atmosphere, may be found preferable inasmuch as the copper is not heavily oxidized following the bonding process.

An inert atmosphere, as that term is used in this application, means that the atmosphere is inert with respect to the metal 21, the bonding agent and the substrate 22 at the temperatures involved. Thus, a gas such as nitrogen can be used. The process can even be effectively carried on in a vacuum. Thus, the atmosphere need not be one of the traditional "inert" gases such as argon.

Referring next to FIG. 4, there is again shown the enlarged hypoeutectic portion of the copper oxygen phase diagram. The copper oxide system is still utilized for exemplary purposes only and what is to be said with respect to FIG. 4 applies to any usable eutectic system.

As was pointed out previously, in the hypoeutectic region above the eutectic temperature and between the solidus and liquidus, a two-phase mixture is present which consists of solid copper and liquid eutectic. Consider the point X which is one half of one present oxygen at approximately 1067° C. The percentage of eutectic liquid at point X equals $$\frac{L}{L+S}$$

where L and S are the line lengths between point X and the solidus and point X and the liquidus at a constant temperature as indicated in FIG. 4. Thus, observation of FIG. 4 shows that a composition of one half of one percent oxygen at 1067° C is more than two-thirds solid copper.

As the temperature is increased, the composition becomes more and more liquid. At approximately 1078° C, indicated by point Y, the mixture of one half of one percent oxygen is over two-thirds liquid. Finally, at approximately 1080° C, the mixture becomes one-phase, entirely liquid.

It has been found that the process is best controlled when the region 23 is predominately solid, even at the most elevated temperature. Thus, it is advantageous to keep the operating temperature well below the melting point of the metal and close to the eutectic temperature. For example, copper can be advantageously bonded at 1072° C. A further advantage of maintaining the temperature well below the melting point of the metal is evident from further study of FIG. 4. If, at point Y, the composition were not one half of one percent oxygen, but inadvertently were made three-quarters of one percent oxygen, it is clear that the entire region 23 would become liquid. The danger of such inadvertent total melting is reduced by operating at lower temperatures.

Considering the above conditions and the considerations to be set forth below, a figure of merit has been selected for determining how well a given eutectic composition will function as a bonding eutectic. The figure of merit is arrived at through a study of the hypoeutectic region of the phase diagram such as is illustrated in FIG. 4. A straight line is drawn connecting the metal melting point and the eutectic point. The figure of merit is the slope of the line expressed as degrees Celsius per atomic percent. Preferably, the figure of merit should be between one and one hundred and, most preferably, it should be as close to 10 as possible. Observation of FIG. 4, for example, shows that the figure of merit for copper is approximately 11.7 degrees Celsius per atomic percent, thus showing copper-copper oxide to be an attractive bonding combination.

The present method involves utilizing a solid state source of the bonding agent which is in direct contact with the metal. FIGS. 5A–5D illustrate several different methods of associating the solid state source with the bonding system. The followng explanation of the several FIGS. 5 will continue with the example of a copper-copper oxide bonding system. However, it should be understood that these methods are not restricted to copper-copper oxide.

Figure 5A:
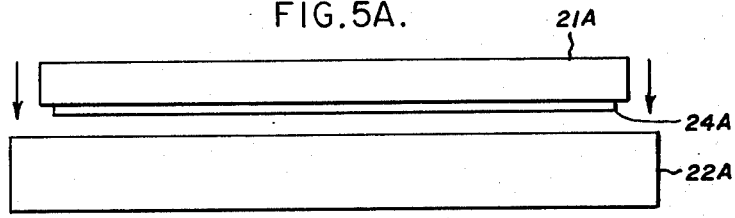
FIGS. 5A–5D diagrammatically illustrate several exemplary methods of introducing the bonding agent into the metal-substrate system.

Referring first to FIG. 5A, there is shown a sheet of copper 21A bearing thereon a layer of copper oxide 24A on the side adjacent the substrate 22A. The copper 21A is positioned on the substrate by moving the copper in the direction shown by the arrows. When the copper is positioned on the substrate, the copper oxide 24A is sandwiched between the copper and the substrate. Thus, the copper oxide 24A is exposed to the interface between the copper 21A and the substrate 22A. The copper oxide layer 24A is preferably very thin so that the final bond formed is hypoeutectic as explained with respect to FIGS. 2 and 3. For example, a layer of cupric oxide can be deposited with a thickness in the range of about 200 to 5,000 Angstroms. Obviously, thinner oxide layers are preferable with thinner copper and vice versa. The layer is so thin that for purposes of this specification, the copper 21A and the substrate 22A are treated as having a directly abutted interface.

After the copper 21A is positioned on the substrate 22A, the combination is heated in an inert atmosphere to a temperature above the eutectic temperature of the copper-copper oxide eutectic but below the melting point of the copper for a sufficient period of time to form a melt at the interface. As previously stated, the temperature is preferably in the range of 1072° Celsius. The heating step is preferably performed in a tunnel oven supplied with a nitrogen atmosphere. In order to prevent excessive dissociation, the temperature rise should be fairly rapid, for example, room temperature to eutectic temperature in three or four minutes or less. A few seconds above the eutectic temperature is adequate to form a bond with thin (1 to 10 mil) copper. Time increases beyond several minutes appear to offer no advantage even for thicker copper. Such times, temperatures, and oxide thicknesses provide a final melt that is hypoeutectic. Upon cooling, the melt solidifies and the bond is formed.

It should be understood that the upper surface of the copper 21A could, in addition to the lower surface, be oxidized if it is more convenient to simply oxidize both surfaces. Oxide on the upper surface will not interfere with the bonding at the copper and substrate interface.

THe oxide can be grown in any convenient manner. For example, it may be thermally grown or chemically formed by the aforementioned Ebonol C or any other oxidizing agent. Yet another alternative is to deposit particulate copper oxide in a layer 24A on the copper. Preferably, the particulate copper oxide is mixed with an appropriate vehicle to make handling easier. Deposition can be by painting, silk screening, or any other appropriate technique. The vehicle is preferably an organic compound that vaporizes during the heating step and thus is not present in the final bond. If it is felt that such a deposition of particulate copper oxide would yield a layer 24A with too high of an oxide content and thus create the danger that the final bond may be hypereutectic, or that all the copper may melt, the particulate copper oxide may be mixed with particulate copper to reduce the percentage of oxygen in the deposition.

The preferred method for bonding 10 ml copper to ceramics is as follows: 1,000 Angstroms of cupric oxide is chemically grown on each side of the copper. The oxidized copper is placed on the substrate and the combination is passed through a tunnel oven and heated, in nitrogen, to about 1072° C in 3 to 3 and ½ minutes and held there for 4 minutes. Upon cooling, the bond is formed.

At equilibrium at 1065° C, 1,000 Angstroms of cuprous oxide forms a melt about 21,500 Angstroms thick. At 1075° C, the melt is about 40,000 Angstroms thick. Ten mils equals 2,500,000 Angstroms. The melts in the preferred process are each less than 40,000 Angstroms thick so that over 2,400,000 Angstroms, or well over 9 mils, of copper remains substantially solid to provide dimensional stability.

Figure 5B:
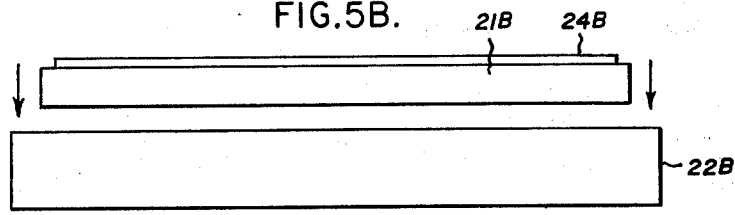

Referring now to FIG. 5B, there is shown a bonding system similar to that shown in FIG. 5A, except that the oxide layer 24B is on the upper surface of the copper 21B. The oxide layer 24B can be chemically or thermally formed on the copper as was described above or can be deposited in a particulate form as was also described above. When the copper layer 21B is moved in the direction of the arrows to be positioned on the substrate 22B, the copper comes in direct contact with the substrate and forms the bonding interface therewith.

In the configuration depicted in FIG. 5B, the bulk of the melt is on the upper surface at the oxide layer 24B during heating. However, as the temperature is increased during the heating step, a certain amount of oxide diffuses through the relatively thin copper by what is believed to be solid state diffusion and reaches the lower surface. Furthermore, it is possible that certain capillary paths of the liquid melt pass through the copper when the temperature exceeds the eutectic temperature, thus permitting a small amount of the melt to directly reach the lower surface of the copper 21B. Inasmuch as the copper 21B and the substrate 22B are abutted at the interface, only a small amount of melt is necessary to substantially fill the interface. Consequently, upon cooling, a bond is formed. When oxidizing the upper surface, the oxide layer is preferably somewhat thicker than the oxide used in the configuration of FIG. 5A, but the times are about the same.

Figure 5C:
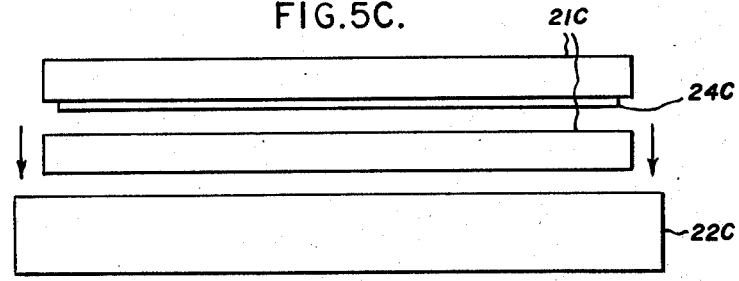

Referring next to FIG. 5C, there is shown yet another variation of the present method. Two copper sheets 21C are used and a layer of copper oxide 24C is placed on at least one of them so that the oxide is between the sheets. It does not matter which sheet the oxide is on because when the sheets are moved in the direction of the arrows, each sheet comes into contact with the thin oxide layer. The oxide layer 24C can, of course, be deposited by any of the aforementioned techniques.

During bonding, the melt initially forms between the copper sheets. Ultimately, a quantity of the melt reaches the interface between the lower copper sheet and the substrate 22C as as described with respect to FIG. 5B. The major portion of the melt remains at the interface between the two metals. Upon cooling, the metals are bonded to each other by the melt therebetween and the lower metal sheet 21C is bonded to the substrate 22C by the melt therebetween.

Figure 5D:
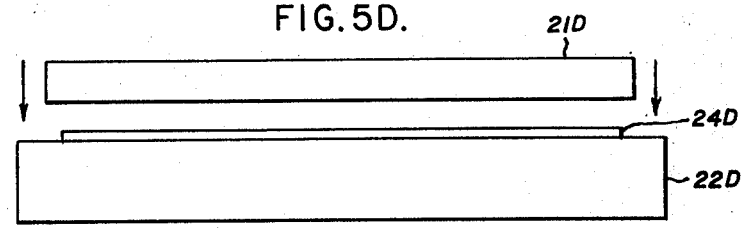

Yet another variation of the method is depicted in FIG. 5D. An oxide layer 24D is deposited on the substrate 22D by any conventional technique such as those disclosed above or by any other conventional technique such as oxidizing a layer of sputtered, evaporated or electroless plated copper. Then, when the metal 21D is moved in the direction of the arrows and comes to rest on the oxide layer 24D, behavior is similar to that described with respect to FIG. 5A, and bonding occurs upon heating and subsequent cooling.

In each of the above variations, the amount of oxygen deposited and the heating cycle are controlled to insure that the final bond is hypoeutectic.

Figure 6:
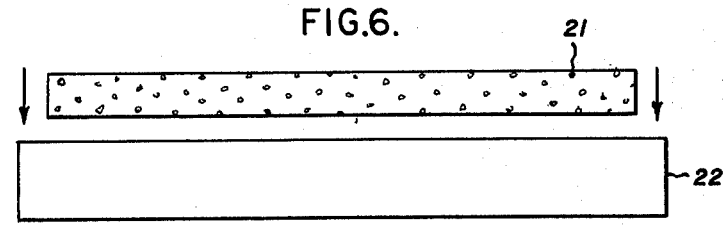
FIG. 6 illustrates yet another way of introducing the bonding agent.

Referring now to FIG. 6, there is shown yet another variation of the present invention. The metal layer 21 in FIG. 6 is electrolytic tough pitch copper, a commonly available form of copper that contains an amount of oxygen sufficient to perform direct bonding. Typically, tough pitch copper contains approximately 100 to 2,000 parts per million of oxygen in the forms of dissolved oxygen and copper oxide. It has been found that the oxygen contained in tough pitch copper is sufficient to provide bonding in a few seconds above 1065° C. Thus, when using tough pitch copper, the solid state source of the bonding agent is the copper itself.

Referring next to FIG. 7, there is shown a pressure mounted semiconductor housing 31 including a ceramic insulator sleeve 32 with a contact 33 affixed to the lower portion thereof. The contact consists of a massive metallic electrode 34 and a flexible disc 35 that is bonded at its periphery to the ceramic sleeve 32. Bonded to the other end of the ceramic sleeve 32 is a thin flange 36 which is welded around its periphery to another contact assembly 40 including a thin flexible disc 37 that supports a second massive metal contact 38. Between the two contacts is a semiconductor pellet assembly 39 which is held centered by a room temperature vulcanizing rubber ring 41. The structure as thus far described is conventional and can be used to house various types of semiconductive devices such as SCRs and rectifiers. If further information on such housings is desired, reference is made to the SCR Manual, copyright 1972 by the General Electric Company, Syracuse, New York.

The housing 31 is shown as an example of a structure which can be advantageously be manufactured by the direct bonding technique disclosed herein as will be described below.

Referring now to FIG. 8, there is shown the ceramic sleeve 32 with portions of copper oxide 42 deposited on the upper and lower surfaces thereof. The oxide can be deposited by any convenient method, but is preferably deposited by silk screening particulate copper oxide and particulate copper in an organic vehicle. After the oxide layer 42 is deposited, the contact assembly 33 and the flange 36 are placed in their final positions and the assembly is subjected to an appropriate heating and cooling cycle to form a direct bond between the ceramic 32, and the disc 35 and the flange 36. It will, of course, be realized that the copper oxide regions 42 could be formed or deposited on the disc 35 and the flange 36. A small weight on the assembly during heating helps assure hermeticity in the finished device.

After the disc 5 and the flange 36 are bonded to the ceramic sleeve 32, the pellet subassembly 39 bearing the ring 41 is put in place and then the upper contact assembly 40 is put in position and the peripheral weld is formed between the disc 37 and the flange 36 to complete device assembly.

Next, a method of constructing an electrical circuit board assembly will be described as an additional illustrative example for a use of the subject method. Shown in FIG. 9 is a lead frame 50 including a peripheral support 51 and a plurality of lands 52–58. It is the lands that will form a conductive regions in the circuit board. The lands are connected to the support by relatively thin support tabs 61. The lead frame can be formed by any conventional technique. For example, both stamping and etching techniques have been successfully performed.

Figure 10:
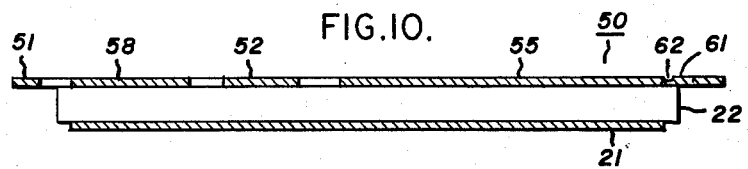
FIG. 10 is an elevation sectional view of the lead frame of FIG. 9 bonded to one side of a ceramic substrate that has a plain metallic plate bonded to the other side.

In FIG. 10, the lead frame 50 is shown in a sectional elevation view placed upon a substrate 22 such as alumina or beryllia. Shown on the lower side of the substrate 22 is a solid copper sheet 21. The solid copper sheet is optional but can be included in such an assembly if desired. The presence of the sheet 21 will permit the entire assembly to be soft soldered or direct bonded to a heat sink, providing excellent thermal and mechanical coupling.

The lead frame 50 and the copper sheet 21 are to be bonded to the ceramic 22 by the technique described hereinbefore. Thus, a bonding agent such as oxygen must be present in the system. Copper oxide can be applied by any of the aforementioned techniques. For example, the metal parts can be pre-oxidized, particulate copper oxide can be deposited, or tough pitch copper can be used.

As shown most clearly in FIG. 10, a small notch 62 is formed in the tab 61 which connects the land 55 to the peripheral support 51. The function of the notch will become apparent below.

Figure 11:
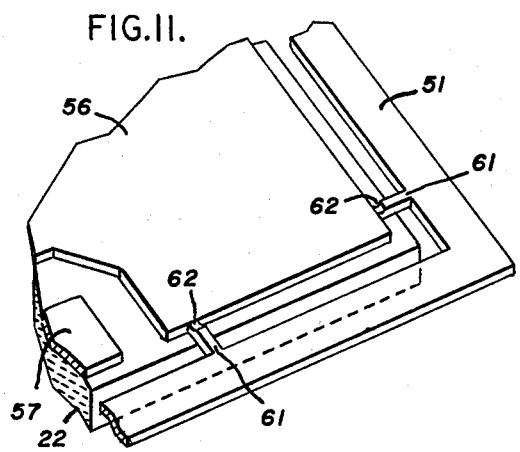
FIGS. 11 and 12 illustrate the removal of a supporting member from the lead frame of FIG. 9 after it is mounted as illustrated in FIG. 10.

FIG. 11 is an isometric view of a corner of the assembly following bonding. It will be appreciated from FIG. 11 that each of the support tabs 61 has a small notch 62 therein near the associated land.

Figure 12:
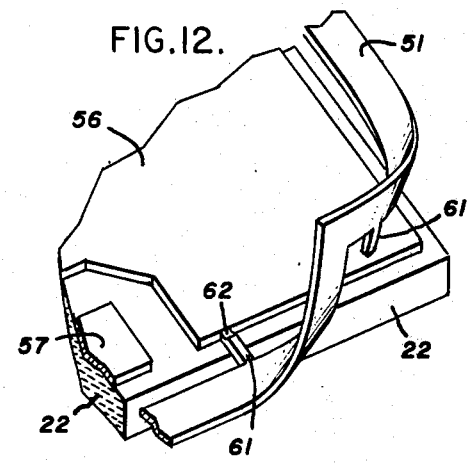

In order to remove the peripheral support 51 after bonding, a corner of the support is grasped and moved upward, as for example in the direction of the arrow in FIG. 11. The only connection between the assembly and the peripheral support 51 is the plurality of tabs. The tabs, although direct bonded to the substrate 22, separate therefrom due to their small size. However, when the tabs have separated up to the point of notch 62, there is insufficient strength in the notched portion to pull remaining copper from the ceramic. Thus, the tabs fracture at the notch as shown isometrically in FIG. 12. It has been found that a seven mil notch in ten mil copper (thus leaving three mils of copper) works well.

Figure 13:
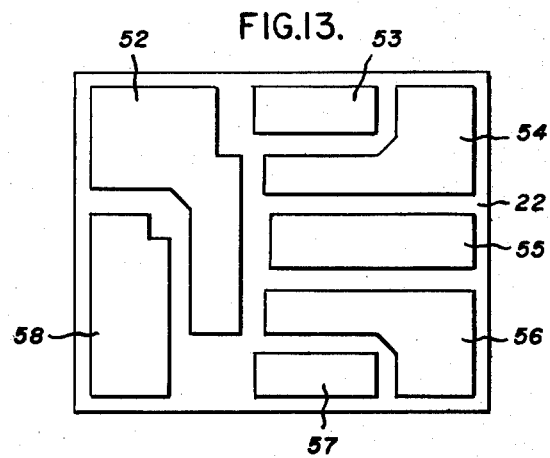
FIG. 13 shows the conductive circuit formed by the utilization of the lead frame shown in FIG. 9.

Referring finally to FIG. 13, there is shown the finished circuit board assembly. It is characterized by a high current conducting capacity inasmuch as the copper is relatively thick as compared to that bonded by conventional processes such as molymanganese. For example, copper in excess of 60 mils in thickness has been successfully bonded. Even at this thickness, the only problem encountered is a thermal mismatch which may crack the substrate if a ceramic is used; there is no problem with the bond per se. Furthermore, the thermal conductivity of the circuit board is excellent since the copper is directly bonded to a ceramic which can be selected to be a good conductor of heat and the direct bonded copper and soft solder connection on the bottom is also an effective conductor of heat.

A few manufacturers of semiconductor devices are now beginning to sell devices in pellet form or in forms with leads coupled thereto that can be attached directly to printed circuit boards and the like. Such devices work particularly well with circuit boards such as shown in FIG. 13. A description of such semiconductor devices can be found in copending U.S. Pat. application, Ser. No. 535,670, filed Dec. 23, 1974, entitled, "Semiconductor Assembly Including Mounting Plate With Recessed Periphery", in the name of P. W. Koenig.

Figure 14:
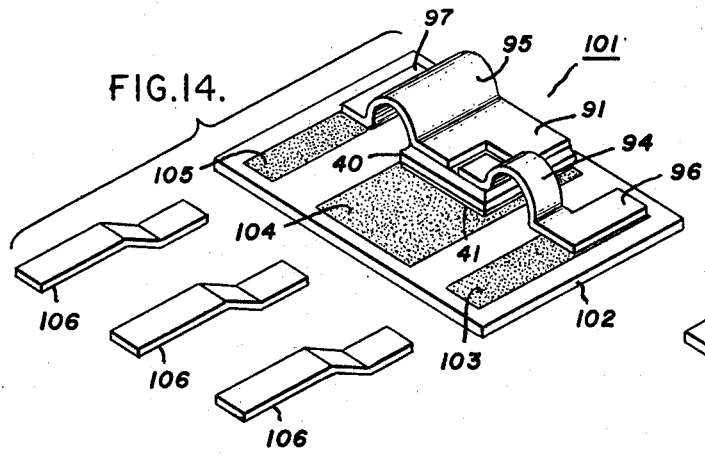
FIG. 14 illustrates an application of a circuit similar to that shown in FIG. 13.

Referring now to FIG. 14, there is shown a specific example of a use for a circuit board such as illustrated in FIG. 13. Illustrated in FIG. 14 is an isolated semiconductor assembly 101 including a pellet assembly 91 that includes a semiconductor pellet 40 and a lower mounting plate 41 bonded thereto. Assume that the pellet 40 is an SCR with a corner gate. Soldered, or otherwise fastened to the gate contact, is a ribbon-shaped gate lead 94. Similarly, soldered or otherwise fastened to the cathode contact is another ribbon-shaped lead 95. By ribbon shaped, it is meant that the leads 94 and 95 are substantially wider than they are high and thus are shaped more like ribbons than conventional wire leads.

Each ribbon-shaped lead has a terminal planar portion 96 and 97. Each terminal planar portion 96 and 97 is in the plane of the lower major surface of the plate 41. Thus, all three contacts are accessible in one plane and the assembly 91 can be placed on a properly patterned substrate and quickly fastened in place.

The assembly 91 can be further improved if the surface of the leads 94 and 95 that is adjacent the pellet is solder clad. With the leads solder clad, the leads need only be placed in position on the pellet and heated in order to bond the lead to the pellet. Furthermore, if the lower surface of the plate 41 is solder clad also, the assembly 91 can simply be placed on a substrate, and the entire assembly heated to quickly and easily electrically, mechanically, and thermally bond the assembly 91 to the substrate.

A ceramic substrate 102 has direct bonded thereto a conductive planar lead 103. A bonding portion of the lead 103 is in registry with the planar portion 96 of the ribbon-shaped lead 94 and bonded, as by soldering, thereto. The portion of the lead 103 that is exposed in FIG. 14 constitutes a contact area for receiving connections to an external circuit.

A second planar conductive lead 104 is similarly direct bonded to the substrate 102 and a bonding area thereof is bonded to the lower surface of the plate 41. Similarly, the exposed portion of the lead 104 constitutes a contact area.

An additional planar conductive lead 105 is direct bonded to the substrate 102 and includes a contact area which is exposed and a bonding area which is bonded to the planar portion 97 of the lead 95.

The assembly 101 is extremely low in cost due to its simplicity and yet is highly reliable for several reasons. For example, each coupling whether it is between a ribbonshaped lead and semiconductor pellet, or between a ribbonshaped lead and a planar lead, is of a relatively large area and is thus secure. Furthermore, both the mounting plate 41 and the ceramic substrate 102 are good conductors of heat, and thus when the substrate is mounted to a heat sink by a system which provides a good thermal path, the pellet 40 is able to dissipate a substantial amount of heat.

Three wiper arms 106 can be positioned on the contact areas of the leads 103, 104, and 105. Spring action can hold the leads 103–105 and the arms 106 in contact, or the arms can be permanently bonded to the contact areas with solder or the like. Thus, it will be appreciated that external connections can be made quickly to the assembly 101.

Figure 15:
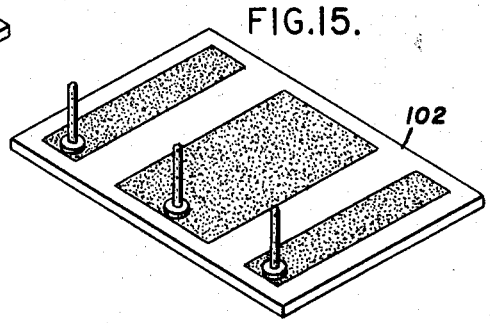
FIG. 15 shows a modification of the device of FIG. 14.

Referring now to FIG. 15, there is shown a modification of the substrate 102. The assembly 91 has been eliminated to simplify the Figure. Nailhead leads are permanently affixed to each of the contact areas and facilitate rapid connection to external circuitry.

While the above exemplary descriptions have been restricted to the copper-copper oxide system, it should be appreciated that many other metals and bonding agents can be employed. For example, the following chart will serve to illustrate some of the various combinations possible.

| Metal | Bonding Agent | Metal Melting Point °C | Eutectic Temp °C | Atomic Percent Bonding Agent at Eutectic | Figure of Merit °C/% |
| --- | --- | --- | --- | --- | --- |
| Iron | Oxygen | 1534 | 1523 | 0.56 | 19.7 |
| Copper | Oxygen | 1083 | 1065 | 1.54 | 11.7 |
| Chromium | Oxygen | 1850 | 1800 | 2.00 | 25.0 |
| Chromium | Sulfur | 1850 | 1550 | 3.5 | 85.8 |
| Copper | Phosphorus | 1083 | 714 | 15.7 | 23.4 |
| Nickel | Oxygen | 1453 | 1438 | 0.87 | 17.3 |
| Nickel | Phosphorus | 1453 | 880 | 19.0 | 30.2 |
| Molybdenum | Silicon | 2625 | 2070 | 16.5 | 33.6 |
| Silver | Sulphur | 960.5 | 906 | 5.8 | 9.4 |
| Silver | Phosphorus | 960.5 | 878 | 3.4 | 24.3 |
| Copper | Sulfur | 1083 | 1067 | 1.5 | 9.4 |
| Cobalt | Oxygen | 1495 | 1451 | 0.23* | * |
| Aluminum | Silicon | 660 | 577 | 11.3 | 7.35 |

*Cobalt is expressed in weight percent

The above chart does not purport to be exhaustive. Recalling that the bonding agent and metal must form a eutectic alloy that is predominately metal and has a eutectic temperature below the melting point of the metal, many other systems can be discerned from a study of phase diagrams such as are found, for example, in *Constitution of Binary Alloys*, by Hansen, copyright 1958 by McGraw-Hill Book Co., New York.

In view of the foregoing, many modifications and variations of the present invention will be apparent to those skilled in the art. For example, where a ceramic is to have metal bonded to each side as depicted in FIG. 10, the metals can be different. The only constraint is that the process requiring the higher bonding temperature should be performed first, then the subsequent lower temperature bonding step will not melt or disturb the previously bonded metal. As another example, some iron is available with a sufficient oxygen content to permit direct bonding without the addition of further oxygen.

It is to be realized, therefore, that the invention can be practiced otherwise than as specifically described.

What is claimed is:

1. A method of bonding a metal to a substrate comprising the steps of:
   selecting a substrate from the group consisting of ceramics and metals,
   selecting a metal which will form a direct bond with said substrate;
   providing a bonding agent compatible with said substrate, said bonding agent being one which forms a eutectic alloy with said metal, said eutectic alloy consisting predominately of said metal and having a eutectic temperature lower than the melting point of said metal;
   positioning said metal on said substrate;
   simultaneously exposing the interface between said metal and said substrate to a solid state source of said bonding agent by having said source in direct contact with said metal, and heating said metal and said substrate in an inert atmosphere to a temperature between said eutectic temperature and said melting point for at least a few seconds to form a melt at the interface between said metal and said substrate, wherein said steps of exposing and heating are carried out such that said melt is at least ultimately hypoeutectic; and
   cooling said melt to form a direct bond between said metal and said substrate.

2. A method according to claim 1 wherein said exposing and heating steps are carried out such that the bulk of said metal remains in the solid phase.

3. A method according to claim 2 wherein said solid state source is a layer of a compound of said metal and said bonding agent on said metal, said layer being very thin as compared to said metal.

4. A method according to claim 3 wherein said layer is on the side of said metal opposite that side which forms said interface.

5. A method according to claim 3 wherein said layer is on the side of said metal that forms said interface.

6. A method according to claim 3 wherein said layer comprises said compound in a particulate form and a vehicle.

7. A method according to claim 6 wherein said vehicle is an organic compound that vaporizes during said heating step.

8. A method according to claim 6 wherein said layer also comprises said metal in particulate form.

9. A method according to claim 2 further comprising passing said substrate with said metal thereon through a tunnel oven to form bonds.

10. A method according to claim 2 wherein, on a phase diagram of said metal and said bonding agent, the absolute slope of a line connecting said melting point and the eutectic point is between 1° and 100° Celsius per atomic percent of bonding agent at said eutectic point.

11. A method according to claim 10 wherein said slope is approximately 10° Celsius per atomic percent of bonding agent.

12. A method of bonding a metal to a substrate comprising the steps of:
   selecting a substrate from the group consisting of ceramics and metals;
   selecting a metal which will form a direct bond with said substrate;
   selecting a bonding agent compatible with said substrate, said bonding agent being one which forms a eutectic alloy with said metal, said eutectic alloy consisting predominately of said metal and having a eutectic temperature lower than the melting point of said metal;
   reacting said metal with a small amount of said bonding agent;
   positioning said metal on said substrate;
   heating said metal and said substrate in an inert atmosphere to a temperature between said eutectic temperature and said melting point for at least a few seconds to form a melt at the interface between said metal and said substrate, wherein said steps of reacting and heating are controlled so that the melt is hypoeutectic; and cooling said metal and said substrate to form a bond.

13. A method according to claim 12 wherein said exposing and heating steps are carried out such that most of said metal remains in the solid phase.

14. A method according to claim 13 wherein said step of reacting comprises forming a layer of a compound of said bonding agent and said metal, said layer being very thin as compared to said metal.

15. A method according to claim 14 wherein said layer is on the side of said metal opposite that side which forms said interface.

16. A method according to claim 14 wherein said layer is on the side of said metal that forms said interface.

17. A method according to claim 14 wherein said layer is formed chemically.

18. A method according to claim 14 wherein said layer is formed thermally.

19. A method of bonding a metal to a substrate comprising the steps of:

selecting a substrate from the group consisting of ceramics and metals;

selecting a metal which will form a direct bond with said substrate, where said metal contains a quantity of a bonding agent which is compatible with said substrate and forms a eutectic alloy with said metal, said eutectic alloy consisting predominately of said metal and having a eutectic temperature lower than the melting point of said metal, said quantity of bonding agent being in the range of about 100 to 2,000 parts per million parts of said metal;

positioning said metal on said substrate;

heating said metal and said substrate in an inert atmosphere to a temperature between said eutectic temperature and said melting point for at least a few seconds to form a melt between said metal and said substrate; and cooling said metal and said substrate to form a bond.

20. A method according to claim 19 wherein said exposing and heating steps are carried out such that the bulk of said metal remains in the solid phase.

21. A method according to claim 19 further comprising passing said substrate with said metal thereon through a tunnel oven to form bonds.

22. A method according to claim 19 wherein, on a phase diagram of said metal and said bonding agent, the slope of a line connecting said melting point and the eutectic point is between 1° and 100° Celsius per atomic percent of bonding agent at said eutectic point.

23. A method according to claim 22 wherein said slope is approximately 10° Celsius per atomic percent of bonding agent.

24. A method of bonding copper to a substrate comprising the steps of:

selecting a substrate from the group consisting of ceramics and metals;

oxidizing at least one surface of a sheet of copper to a thickness in the range of about 200 Angstroms to about 5,000 Angstroms;

positioning said copper on said substrate; and heating said copper and said substrate in an inert atmosphere to a temperature between 1065° and 1083° Celsius for a time sufficient to form a hypoeutectic melt at the interface between said copper and said substrate; and cooling said copper and said substrate to form a bond.

25. A method according to claim 24 wherein said exposing and heating steps are carried out such that the bulk of said copper remains in the solid phase.

26. A method according to claim 24 where said oxidized surface is the side of said copper opposite that side which is adjacent said substrate.

27. A method according to claim 24 wherein said oxidized surface is the side of said copper that forms said interface.

28. A method according to claim 27 further comprising passing said substrate with said copper thereon through a tunnel oven to form bonds.

29. A method according to claim 24 wherein said heating step is carried on such that said copper and said substrate are above 1065° C for a period of a few seconds to several minutes.

30. A method according to claim 24 wherein said copper is oxidized chemically.

31. A method according to claim 24 wherein said copper is oxidized thermally.

32. A method according to claim 24 wherein said substrate is ceramic.

33. A method according to claim 24 wherein said copper is oxidized on both surfaces.

34. A method according to claim 24 wherein said copper is about 10 mils thick.

35. A method of bonding copper to a substrate comprising the steps of:

selecting a substrate from the group consisting of metals and ceramics;

selecting copper containing from about 100 to about 2,000 parts per million oxygen distributed therein;

positioning said copper on said substrate;

heating said copper and said substrate in an inert atmosphere to a temperature between 1065° and 1083° Celsius for a time sufficient to form a hypoeutectic melt between said copper and said substrate; and cooling said copper and said substrate to form a direct bond.

36. A method according to claim 35 wherein said exposing and heating steps are carried out such that most of said copper remains in the solid phase.

37. A method according to claim 35 wherein said copper is electrolytic tough pitch copper.

38. A method according to claim 35 wherein said substrate is ceramic.

39. A method of making a circuit board comprising the steps of:

selecting a ceramic substrate;

selecting for conductive leads, a metal which will form a direct bond with said substrate;

providing a bonding agent compatible with said substrate, said bonding agent being one which forms a eutectic alloy with said metal, said eutectic alloy consisting predominately of said metal and having a eutectic temperature lower than the melting point of said metal;

positioning said metal on said substrate;

simultaneously exposing the interface between said metal and said substrate to a solid state source of said bonding agent by having said source in direct contact with said metal, and heating said metal and said substrate in an inert atmosphere to a temperature between said eutectic temperature and said melting point for at least a few seconds to form a melt at the interface between said metal and said substrate, wherein said steps of exposing and heating are carried out such that said melt is at least ultimately hypoeutectic; and cooling said melt to form a direct bond between said metal and said substrate.

40. A method according to claim 39 wherein said metal is patterned.

41. A method according to claim 39 wherein said metal comprises a plurality of land areas interconnected by support means and wherein said method further comprises, following said cooling step, a step of removing said support means.

42. A method according to claim 41 wherein said metal comprises relatively small tabs coupling said support means and said lands, and said support means is separated from, and thus not bonded to, said substrate, and said step of removing said support means comprises breaking said tabs.

43. A method according to claim 42 wherein said tabs are notched.

44. A method according to claim 42 wherein said metal is copper, said bonding agent is oxygen, and said substrate is selected from the group consisting of alumina and beryllia.

* * * * *